United States Patent
Botti

(10) Patent No.: US 9,577,582 B2
(45) Date of Patent: Feb. 21, 2017

(54) METHOD OF REDUCING POWER DISSIPATION IN A SWITCHING AMPLIFIER AND CIRCUIT IMPLEMENTING SUCH METHOD

(71) Applicant: STMICROELECTRONICS S.r.l., Agrate Brianza (IT)

(72) Inventor: Edoardo Botti, Vigevano (IT)

(73) Assignee: STMICROELECTRONICS S.R.L., Agrate Brianza (MB) (IR)

( * ) Notice: Subject to any disclaimer, the term of this patent is extended or adjusted under 35 U.S.C. 154(b) by 160 days.

(21) Appl. No.: 14/512,704

(22) Filed: Oct. 13, 2014

(65) Prior Publication Data

US 2015/0109055 A1 Apr. 23, 2015

(30) Foreign Application Priority Data

Oct. 23, 2013 (IT) .............................. MI2013A1762

(51) Int. Cl.
*H03F 3/217* (2006.01)
*H03F 1/04* (2006.01)
*H03F 1/02* (2006.01)

(52) U.S. Cl.
CPC ......... *H03F 1/0233* (2013.01); *H03F 1/0205* (2013.01); *H03F 3/2171* (2013.01);
(Continued)

(58) Field of Classification Search
CPC .................................. H03F 3/217; H03F 1/04
(Continued)

(56) References Cited

U.S. PATENT DOCUMENTS 5,539,630 A * 7/1996 Pietkiewicz ........ H02M 3/3372
363/132
5,721,490 A * 2/1998 Takano .............. G01R 33/3852
324/322

(Continued)

FOREIGN PATENT DOCUMENTS

WO 2008050273 A2 5/2008
WO 2012055968 A1 5/2012

OTHER PUBLICATIONS

Hwu et al., "Output Power Enhancement of Full-Bridge Class-D Amplified," The 2010 International Power Electronics Conference, pp. 557-561.

*Primary Examiner* — Patricia T Nguyen
(74) *Attorney, Agent, or Firm* — Allen, Dyer, Doppelt, Milbrath & Gilchrist, P.A.

(57) ABSTRACT

A method is for reducing power dissipation in a switching amplifier. The method may include comparing a load current with a ripple current and, if the load current is greater than the ripple current, then detecting a first potential value at a first output terminal of the switching amplifier, detecting a second potential value at a second output terminal of the switching amplifier, detecting a third potential value between first and the second terminals of a first capacitor, and coupling the first terminal of the first capacitor to one of the first output terminal and the second output terminal. The second terminal of the first capacitor may be coupled to a reference voltage, the first output terminal, or the second output terminal based upon whether the first potential value or the second potential value is equal to the third potential value.

21 Claims, 9 Drawing Sheets

(52) U.S. Cl.
CPC ....... *H03F 3/2173* (2013.01); *H03F 2200/03* (2013.01); *H03F 2200/171* (2013.01); *H03F 2200/267* (2013.01); *H03F 2200/351* (2013.01); *H03F 2200/471* (2013.01)

(58) Field of Classification Search
USPC ...................................... 330/251, 302, 207 A
See application file for complete search history.

(56) References Cited

U.S. PATENT DOCUMENTS

| | | | | |
|---|---|---|---|---|
| 6,985,034 | B1* | 1/2006 | Prokin | H02M 1/44 330/207 A |
| 2007/0063764 | A1* | 3/2007 | Nadd | H03F 3/2171 330/10 |
| 2007/0115055 | A1* | 5/2007 | Mendenhall | H03F 3/217 330/251 |
| 2009/0243722 | A1* | 10/2009 | Liu | H03F 1/26 330/251 |
| 2011/0304400 | A1* | 12/2011 | Stanley | H03F 1/26 330/295 |

* cited by examiner

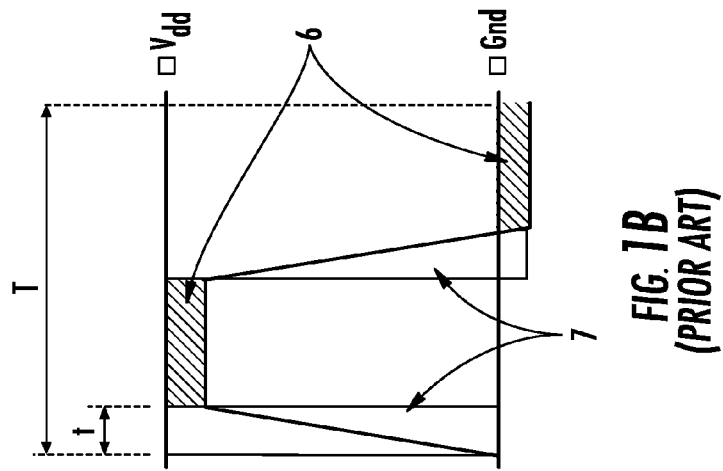
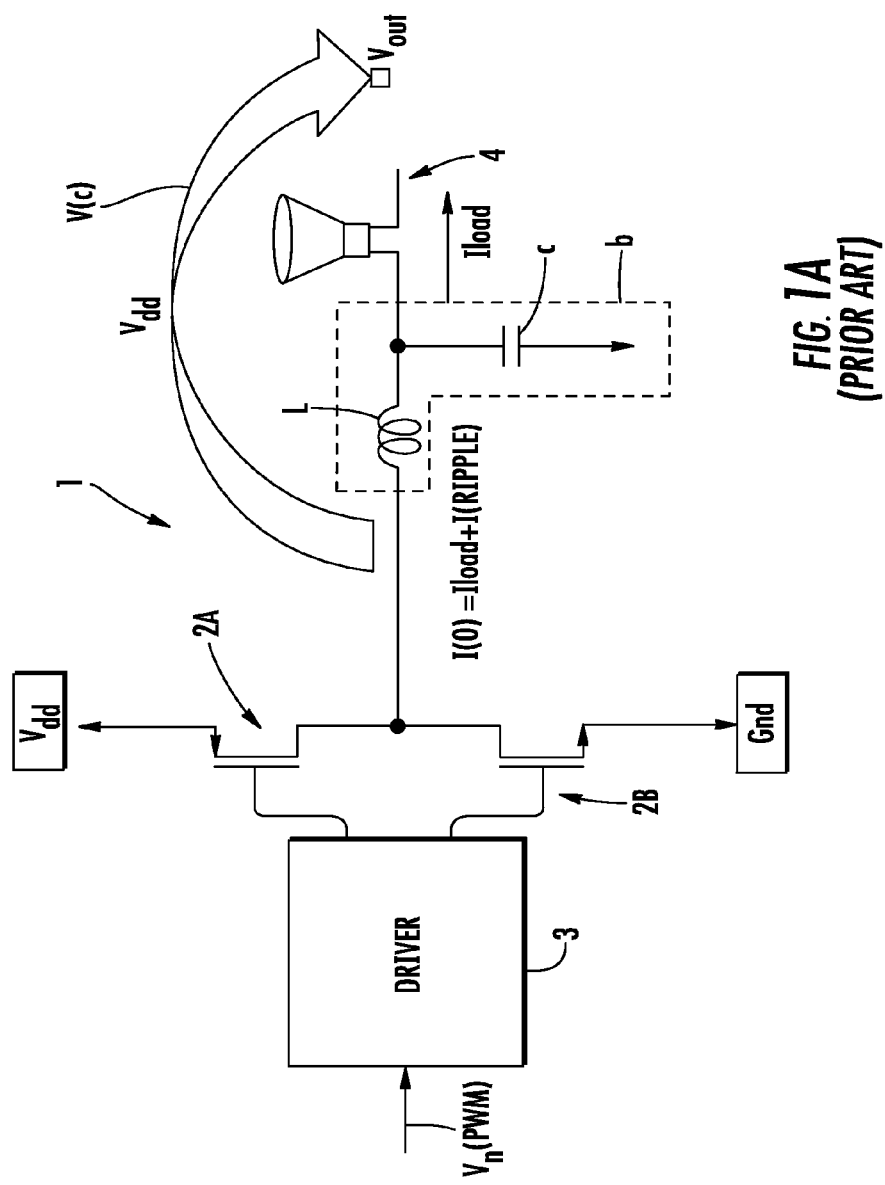
FIG. 1A
(PRIOR ART)
FIG. 1B
(PRIOR ART)

METHOD OF REDUCING POWER DISSIPATION IN A SWITCHING AMPLIFIER AND CIRCUIT IMPLEMENTING SUCH METHOD

TECHNICAL FIELD

The present disclosure relates to a method for reducing power dissipation in a switching amplifier and related circuits.

BACKGROUND

Switching amplifiers comprise electronic power switches that have the purpose of controlling loads of various types (e.g. of R, L, C type). Also referring to FIG. 1A, a half-bridge switching amplifier 1 is shown, which is configured to control a RLC load, such as a speaker 4, through a filter 5, such as a low-pass filter (e.g. of the LC type). The power dissipated by the electronic switches 2A, 2B, which in this case are two MOS power transistors (but may also be bipolar transistors or IGBTs) connected in series between a supply voltage reference Vdd and a ground reference GND and controlled by a driver 3 which in turn receives a control signal Vin of pulse width modulated (PWM) type, comprises three contributors.

Particularly, the first contributor to dissipated power is given by the power dissipated due to quiescent current: P(q). This term designates the power dissipated by the device due to the current absorbed by the driver 3 in addition to the control current of the final power transistors 2A and 2B. The second contributor to dissipated power is given by the power dissipated due to conduction: P(c), i.e. the power dissipated by the power transistors 2A, 2B when they are "ON." Assuming that I(o) is the output current that flows in the power transistors 2A, 2B and V(c) is the voltage at the ends of the load 4, then the instantaneous power P(c) is:

$$P(c)=I(o) \times V(c).$$

If the power transistors 2A, 2B comprise power MOS whose drain-source resistance in the "ON" state is R(on), then the voltage at the ends of the load 4 is:

$$V(c)=I(o) \times R(on).$$

A third contributor to dissipated power is given by the power dissipated due to switching: P(s). This term designates the power dissipated by the amplifier 1 during the switching edges of the output wave from zero to Vdd or vice versa. Assuming the load 4 is inductive, the output current I(o) during the switching time t may be deemed to be constant. Also, assuming a linear drain-source voltage ramp Vds, the power dissipated during this time t will be:

$$P(s)=\tfrac{1}{2} I(o) \times Vdd.$$

If T is the period of the switching frequency fsw, then the average dissipated power due to switching will be:

$$P(s\_ave)=2 \times P(s) \times t/T.$$

Based on this formula, a person may conclude that, assuming a switching time that tends to zero, the average power dissipated due to switching P(save) will also tend to zero. In practice, due to various reasons, such as the difficulties of controlling and handling excessively high "di/dt" slopes, as well as problems concerning electromagnetic emissions, it may not be possible to reduce the switching time "t" beyond a given limit. The chart of FIG. 1B shows the losses caused by power dissipation due to conduction P(c) (see area 6 of the chart) and by power dissipation due to switching P(s) (see area 7 of the chart) during the period T of the switching frequency fsw.

In order to minimize the power dissipated due to switching, some approaches have developed "resonant," "quasi resonant" or "soft switching" systems in which, the use of a further resonant LC cell in addition to the one that is generally provided in the output filter, allows the final transistors 2A, 2B of the half bridge to be only turned on when the voltage at their ends is zero or when the output current drops. Generally, these switching systems are more complex than those of a simple bridge switching amplifier as shown in FIG. 1A, as switching systems may require inductors and sometimes additional transformers.

SUMMARY

Generally speaking, a method is for reducing power dissipation in a switching amplifier. The method may include comparing a load current with a ripple current and, if the load current is greater than the ripple current, then detecting a first potential value at a first output terminal of the switching amplifier, detecting a second potential value at a second output terminal of the switching amplifier, detecting a third potential value between first and the second terminals of a first capacitor, and coupling the first terminal of the first capacitor to at least one of the first output terminal and the second output terminal. The second terminal of the first capacitor may be coupled to a reference voltage, the first output terminal, or the second output terminal based upon whether the first potential value or the second potential value is equal to the third potential value.

BRIEF DESCRIPTION OF THE DRAWINGS

FIG. 1A shows a diagram of a switching amplifier of the prior art.

FIG. 1B shows the power dissipation contributions in the switching amplifier of FIG. 1A.

DETAILED DESCRIPTION

Figures 2A, 2B:
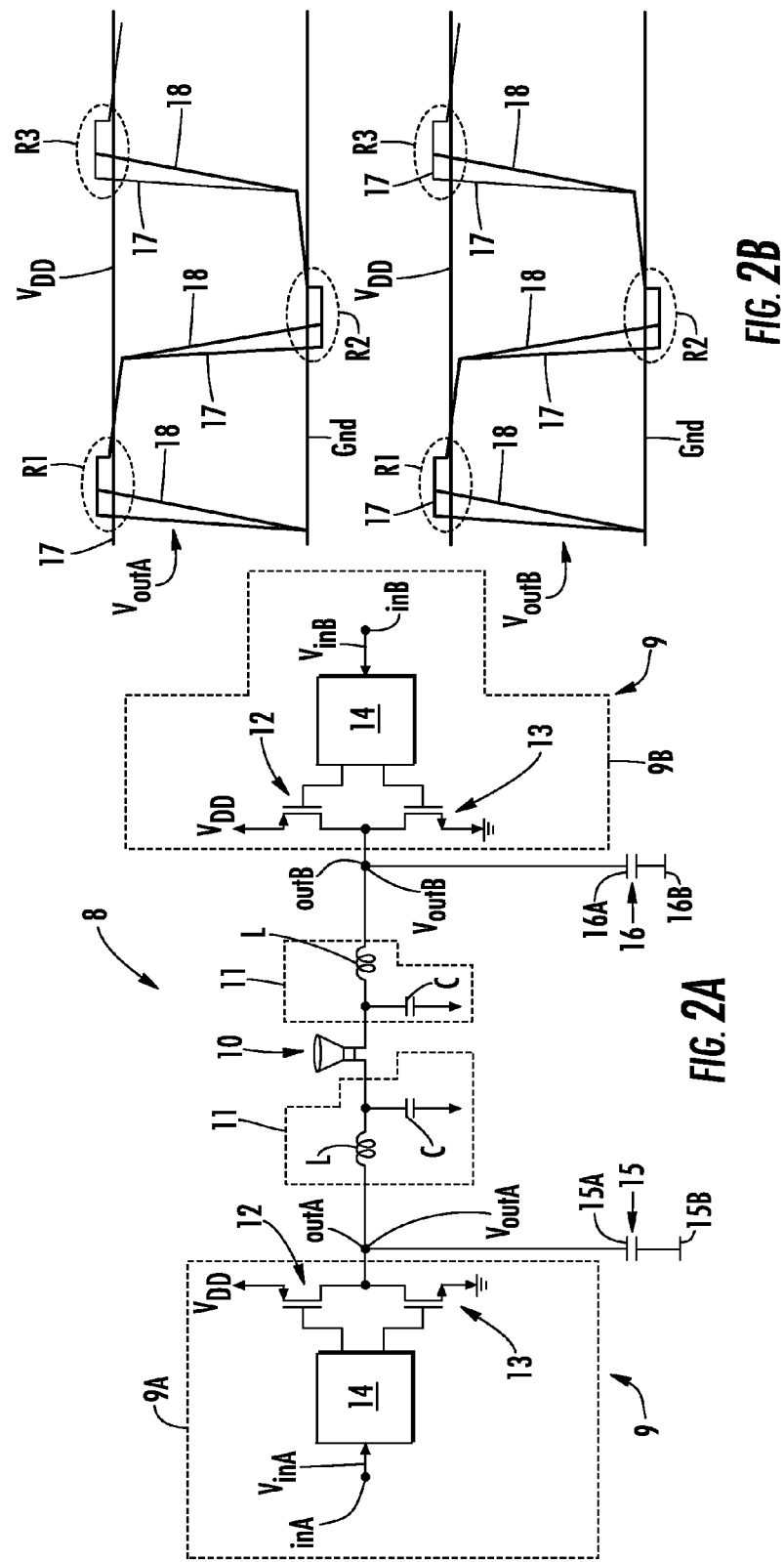
FIGS. 2A and 2B show a first embodiment of the diagram of a switching amplifier of the present disclosure, when the switching amplifier is controlled by an in-phase control signal and the output current signal is lower than the ripple current superimposed on the output current, and the power dissipation contributions of the switching amplifier as shown in FIG. 2A, respectively.

Although this is not expressly shown, the individual features described with reference to each embodiment shall be intended as auxiliary and/or interchangeable with other features, as described with reference to other embodiments. Parts that have been described with reference to the prior art will be designated hereinbelow, for simplicity, by the same numerals.

The faithful transfer of the PWM control into a power output, following a square-wave input with adequate fidelity, may be a complex achievement. This may be important especially when the switching system is part of an audio power amplifier, which must be characterized by low harmonic distortion. The object of the present disclosure is to provide a method and circuit for reducing power dissipation, particularly due to switching, in a switching amplifier, that do not require a reduction of the switching time "t."

A further object of the present disclosure is to reduce the dissipated power without increasing electromagnetic energy generation. Furthermore, with the present disclosure, the power dissipated due to switching P(s) may be reduced to levels that allow power dissipation with no additional element, i.e. only using the printed circuit as a dissipater.

The figures show an electronic circuit 8 for reducing power dissipation in a switching amplifier 9 as described herein. Particularly, the switching amplifier 9 comprises a first input terminal inA and a second input terminal inB and a first output terminal outA and a second output terminal outB. The switching amplifier 9 of the present disclosure has a full-bridge topology, such that it can control a RLC (resistive-inductive-capacitive) load 10, such as a speaker. The full bridge switching amplifier 9 comprises an output stage 9A and 9B with a so-called half-bridge structure, which is configured to control a load 10 through a filter 11, such as a LC low-pass filter.

Each of these stages 9A, 9B includes a series of electronic switches 12, 13, which are connected in series between a supply voltage reference VDD and a ground voltage reference GND. It shall be noted that each series of electronic switches 12, 13 is controlled by its own driver 14, which in turn receives a control signal VinA and VinB, modulated through a control signal modulator, preferably of the PWM type. This form of modulation is known and will not be further described herein.

In the exemplary case, as shown in the figures, the series of electronic switches 12, 13 includes two MOS power transistors (although they may also be bipolar transistors or IGBTs), where the high-side MOD transistor 12 is of the P-channel type, and the low-side MOD transistor 13 is of the N-channel type. Alternatively, it shall be immediately noted that the two switches 12, 14 may be both N-channel MOS power transistors.

Particularly, referring to the waveforms of FIGS. 2B, 3B, 6C and 70, if the control signal VinA, VinB is a PWM signal, then the signal at the output node outA, outB of the switching amplifier 9 will be a square-wave signal. Thus, a triangular-wave current Iripple will flow on the inductor L of the filter 11. This current Iripple is superimposed on the current Iload that flows in the load 10.

If the triangular-wave current Iripple is higher than the current Iload that flows in the load 10, then the current in the inductor L will go to zero at every half period. Particularly, if the current goes to zero at every half-cycle, the output waveform VoutA, VoutB will be as shown in FIG. 2B, with a single recirculation for each half-wave. In this case, efficiency would be also increased without switching the capacitors between the output and the ground.

Figure 6A:
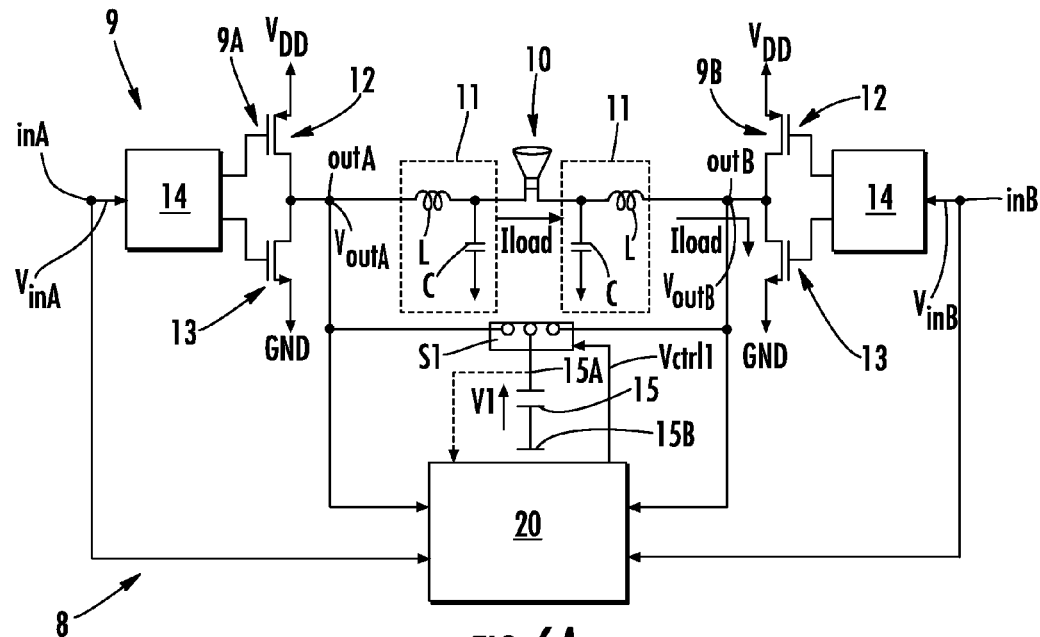
FIG. 6A shows a second embodiment of the diagram of a switching amplifier of the present disclosure, when the switching amplifier is controlled by an in-phase control signal.
Figure 6B:
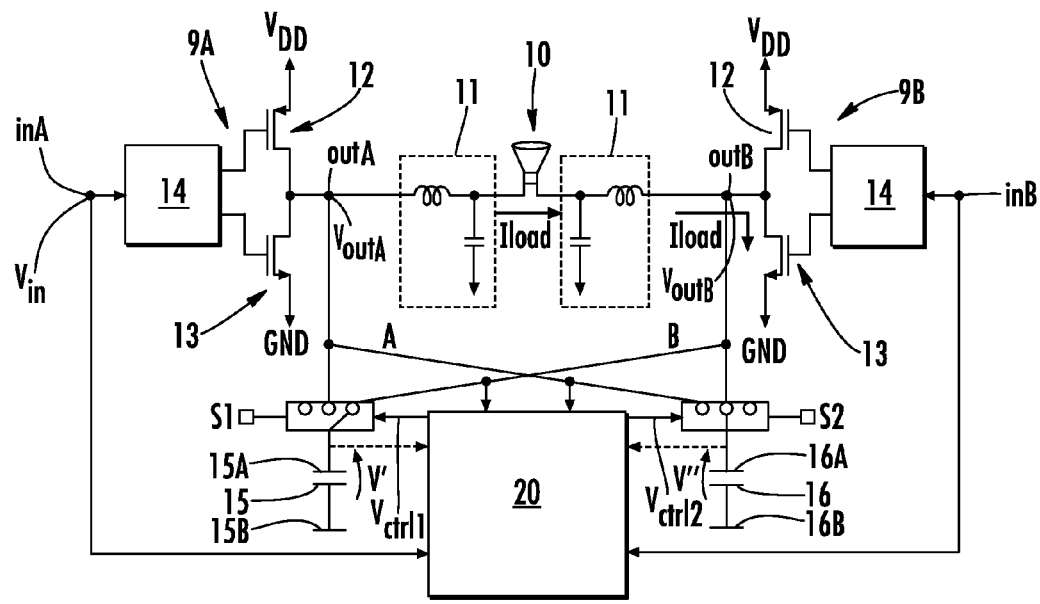
FIG. 6B shows a third embodiment of the diagram of a switching amplifier of the present disclosure, when the switching amplifier is controlled by an in-phase control signal.
Figure 6C:
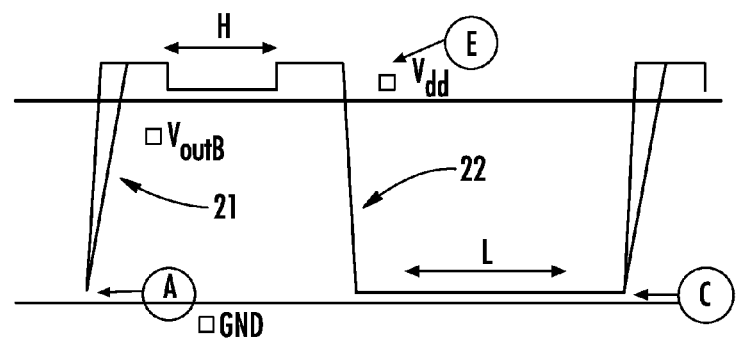
FIG. 6C shows the power dissipation contributions in the switching amplifiers of FIGS. 6A and 6B.
Figure 6C:
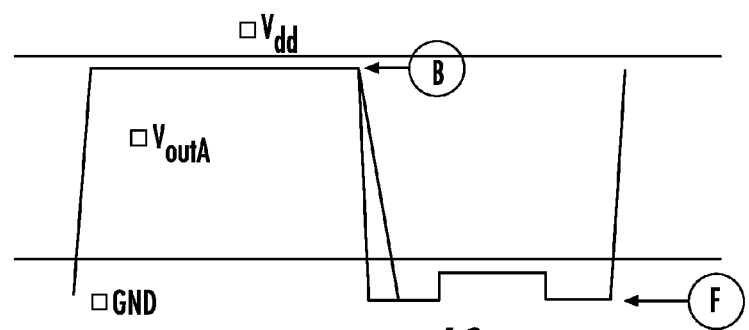
Figure 7C:
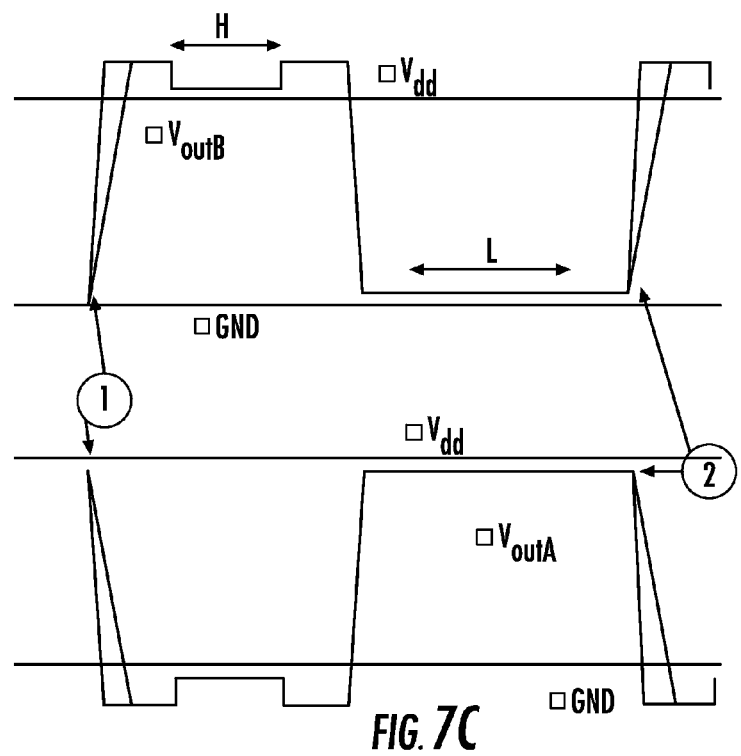
FIG. 7C shows the power dissipation contributions in the switching amplifiers of FIGS. 6A and 6B.

Conversely, if the current does not go to zero at every half-cycle, then VoutA, VoutB will be as shown in FIGS. 6C and 7C, with two recirculations on one of the two half-waves. In this case, the capacitors must be appropriately switched on the two outputs to increase efficiency. It shall be noted that the PWM waveforms of FIGS. 2B, 3B, 6C and 7C have a 50% duty cycle for simplicity of illustration, although the concept set forth below also apply at duty cycles other than 50%.

case of Iload=0 or lower than Iripple

FIGS. 2A-2B and 3A-3B, in which previously described elements are designated by identical reference numbers, show a first embodiment of the electronic device 8 for reducing the dissipated power in the switching amplifier 9 when the inputs inA, inB of the switching amplifier are controlled by an in-phase (FIGS. 2A and 2B) or out-of-phase (FIGS. 3A and 3B) control signal VinA, VinB. If the control signal VinA, VinB is an out-of-phase signal (FIGS. 3A and 3B), the device 8 is shown to comprise a phase-inverting device INV, for inverting the control signal VinA, VinB. This phase-inverting device INV is placed at the input of the first and second input terminals inA, inB of the switching amplifier 9. Particularly, the phase-inverting device INV is connected between the first input terminal inA and the second input terminal inB of the switching amplifier 9 to control the first input terminal inA with the control signal Vin and the second input terminal inB with the out-of-phase control signal Vin, or vice versa.

Figures 3A, 3B:
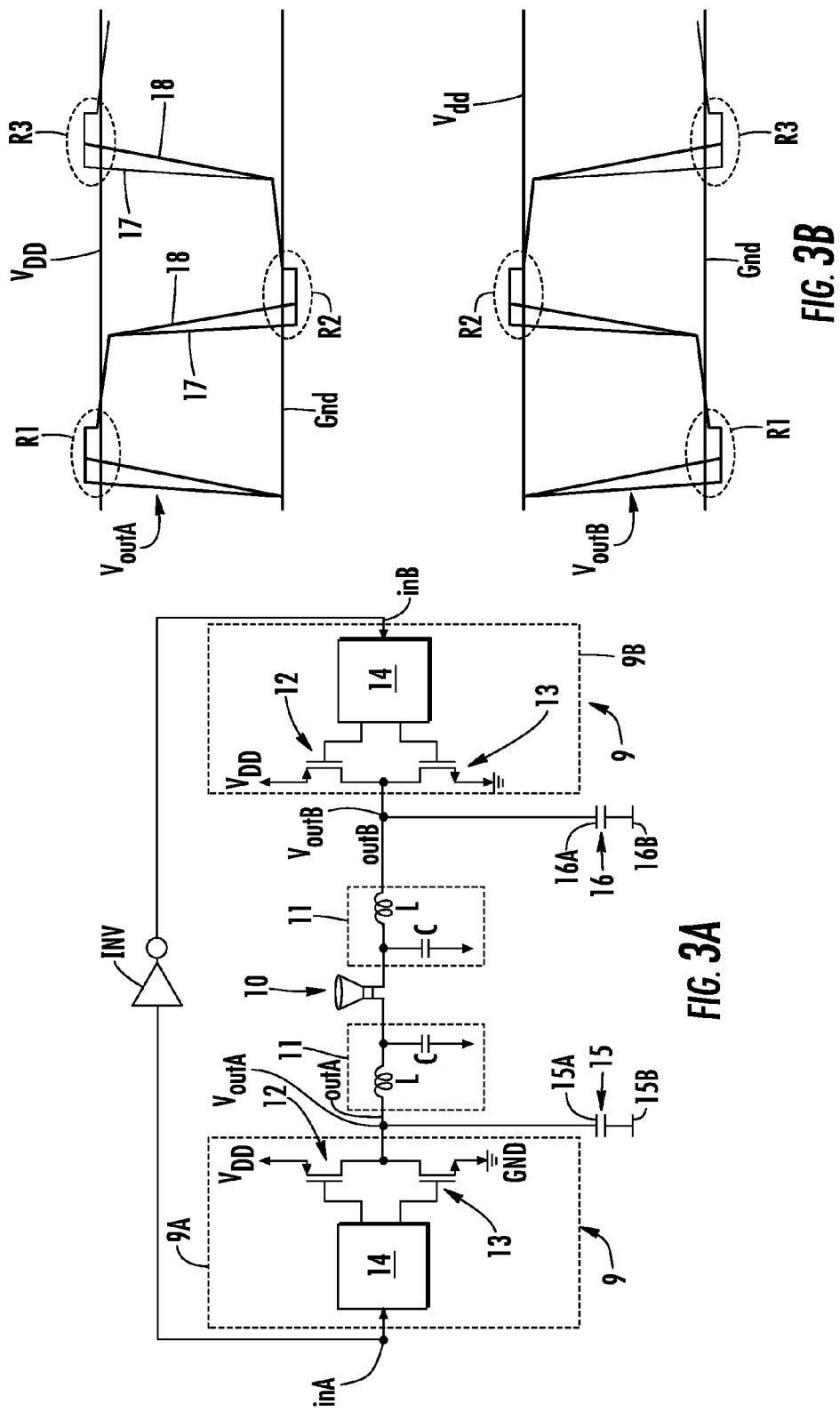
FIGS. 3A and 3B show the first embodiment of the diagram of a switching amplifier of the present disclosure with an inverter coupled to inputs thereof, when the switching amplifier is controlled by an out-of-phase control signal and the output current signal is lower than the ripple current superimposed on the output current, and the power dissipation contributions of the switching amplifier as shown in FIG. 3A, respectively.

Considering a "ternary" modulation, the outputs outA and outB downstream from the output stage 9A and 9B respectively, i.e. the circuit nodes before the filter 11 will have the same curve, unlike the case in which the carrier of the signal carrier VinA, VinB is out-of-phase, which is anyway totally equivalent from this point of view (FIG. 3A). Due to the presence of the inductor L of the filter 11 and the "dead zones" in which both switches 12 and 13 (i.e. the MOS power transistors) are off, the waveforms of the signals VoutA and VoutB have a curve as shown in FIGS. 2B and 3B.

Particularly, it may be noted that the waveforms of the signals VoutA and VoutB have zones or recirculations R1, R2 and R3 that lie above the line identifying the positive supply value, i.e. Vdd, and below the line identifying the ground value, i.g. GND, on each edge of the signals VoutA and VoutB, to later invert the sign at the end of the "hold" period of each half-wave. It may be noted that as the signals VoutA and VoutB rise and fall, the current Iload that flows in the inductor L is supplied by the MOS transistor that is about to be turned off. Particularly, this MOS transistor will be completely turned off when the current Iload will start to flow in the inherent drain-source diode of the other MOS transistor.

In view of the above, if upon comparison of the load current Iload with the ripple current Iripple, the load current Iload results to be lower than the ripple current Iripple, then a first capacitor 15 having first 15A and second 15B terminals, and a second capacitor 16 also having first 16A and second 16B terminals will be provided. Particularly, the first terminal 15A of the capacitor 15 will be connected to the first output terminal outA and the second terminal 15B of the first capacitor 15 will be connected to ground GND. Also, the first terminal 16A of the second capacitor 16 will be connected to the second output terminal outB and the second terminal 16B of the second capacitor 16 will be connected to ground GND.

In other words, the electronic device 8 has a first capacitor 15 and a second capacitor 16, each having a first terminal 15A, 16A and a second terminal 15B, 16B, where the first terminal of the first capacitor 15 is connected to the output terminal outA and the second terminal is connected to ground GND, whereas the first terminal of the second capacitor 16 is connected to the output terminal outB and the second terminal of the second capacitor is connected to ground.

With the introduction of the capacitors 15 and 16 between the outputs of the stages 9A and 9B and the ground, during the rising and falling ramps of the output signals VoutA and VoutB, the current Iload may be absorbed or supplied by the capacitor 15 and/or 16, which will reduce or virtually eliminate power dissipation in the MOS transistor. In order that most of the current may flow in the capacitor and not in the MOS transistor, the slope that the output signals VoutA and VoutB would have without the capacitor (line 17) must be steeper than that caused by the capacitor (line 18), i.e.:

$$dV/dt = Iload/C$$

Considering the switching frequency fsw of the MOS transistors, power dissipation reduction as compared with a system in which the capacitors 15 and 16 have not been introduced, is as follows.

$$Psave @ 2*C*fsw*VDD*VDD.$$

This saved power Psave is equal to the dissipated power Pdiss of a device without the capacitors 15 and 16 but with the same rise/fall time.

In other words, the introduction of the capacitors 15 and 16 between the outputs outA, outB of the stages 9A and 9B and the ground GND has the effect of eliminating switching losses in the switching amplifier 9.

Figure 4:
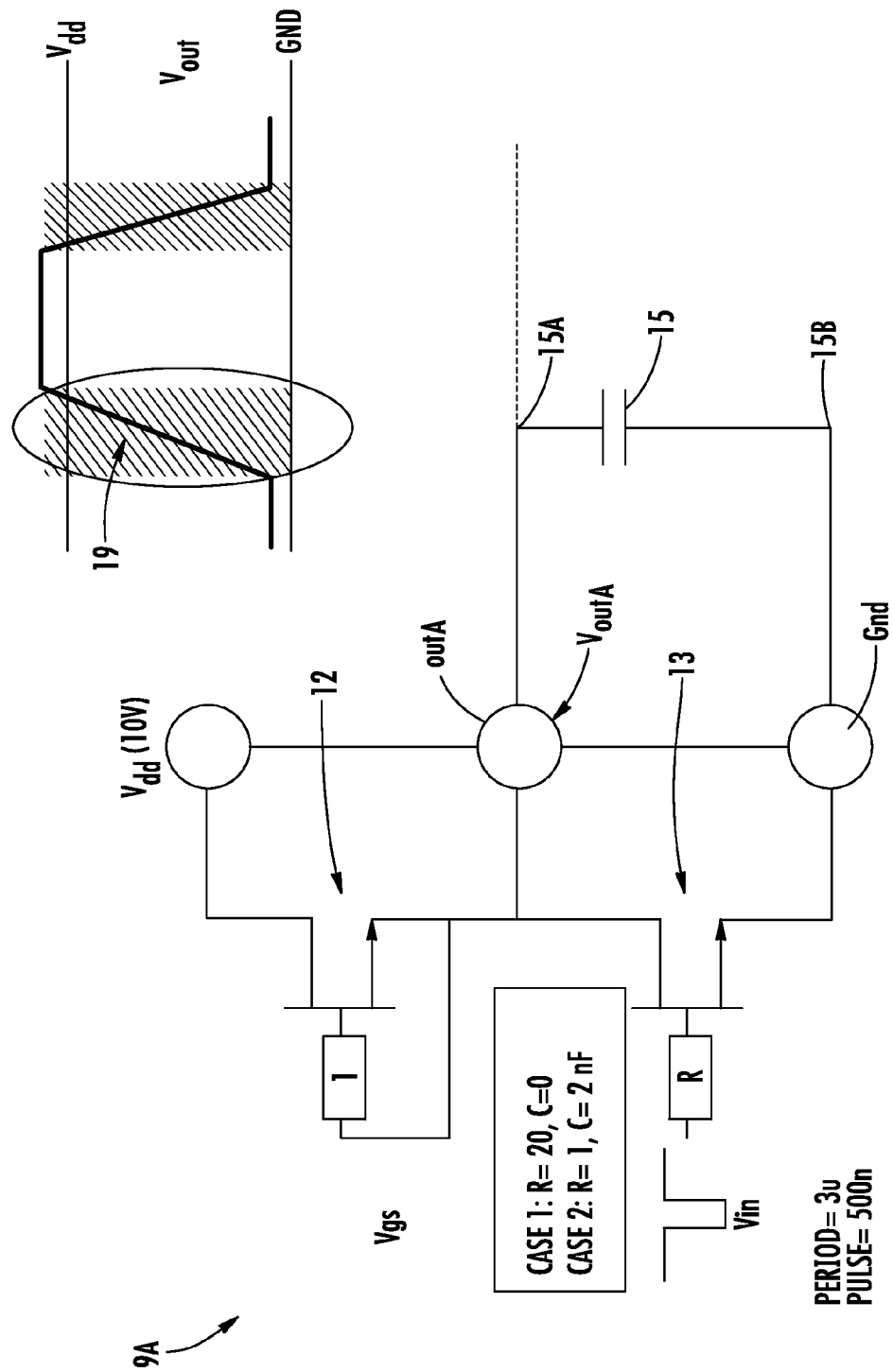
FIGS. 4 and 5 show a possible circuit implementation of the diagram of FIG. 2A or 3A and a series of simulations in two different cases of use of the simulation of FIG. 4, respectively.

Thus, also referring to the circuit of FIG. 4, which represents, for example, the output stage 9A of the switching amplifier 9 where, for example, the supply voltage Vdd is set to 10 V, the control signal Vin is a PWM signal and is present at the node inA, and the current Iload is set to 2A and has an incoming direction with respect to the output node outA, the MOS transistor 12 is always off and is a N-channel transistor, then, considering for simplicity only the rising edge 19 of the incoming current Iload that, as shown in FIGS. 2A and 3A is the only one that benefits from the introduction of the capacitors 15 and 16, there may be two possible scenarios:

Scenario 1: the control resistor R of the MOS transistor 13 is set to 20 Ohm, without the output capacitor 15 of the present disclosure;

Scenario 2: the control resistor R of the MOS transistor 13 is set to 1 Ohm, and the output capacitor 15 is set to 2 nF.

Under these conditions, the rising times for the output signals Vout are very similar. Thus, FIG. 5 also shows the waveforms of the voltage between the gate and source terminals Vgs of the MOS transistor 13 and the voltage VoutA at the output node outA for the above two cases.

In "scenario 1," the curve of the voltage Vgs of the MOS is the conventional curve for this type of circuit: it falls to the voltage at which the low-side driver starts to move from the ohmic zone to the linear zone, beyond which the output voltage starts to rise due to the current of the incoming load. The Miller effect of the capacitor Cgd, that must charge until it reaches the voltage Vdd at its ends, allows the voltage Vgs to temporarily settle at a voltage Vgs compatible with a current Idrain of 2A. Only when the output voltage VoutA reaches the positive value that it is expected to have (typically Vdd plus the voltage of the diode associated with the transistor 12 concerned by the output current), the voltage Vgs may drop to zero. During the rising time, the instantaneous dissipated power for the MOS transistor 13 is:

$$Pd(t) = VoutA(t)*Iload = VoutA(t)*2.$$

In "scenario 2," the off resistance R for switching off the voltage Vgs is 1 Ohm, such that the voltage Vgs quickly drops to zero. The output capacitor 15 prevents the output voltage VoutA from abruptly reaching VDD, by absorbing the 2A current itself. The VoutA will rise with a slope of: Dv/dt=Iload/C=2/2 nF@10 V for 10 nS, which is approximately the same slope as the case 1. In this case, during the transition, the MOS transistor 13 absorbs a very small amount of current, essentially due to the capacitors associated with its drain terminal.

Figure 5:
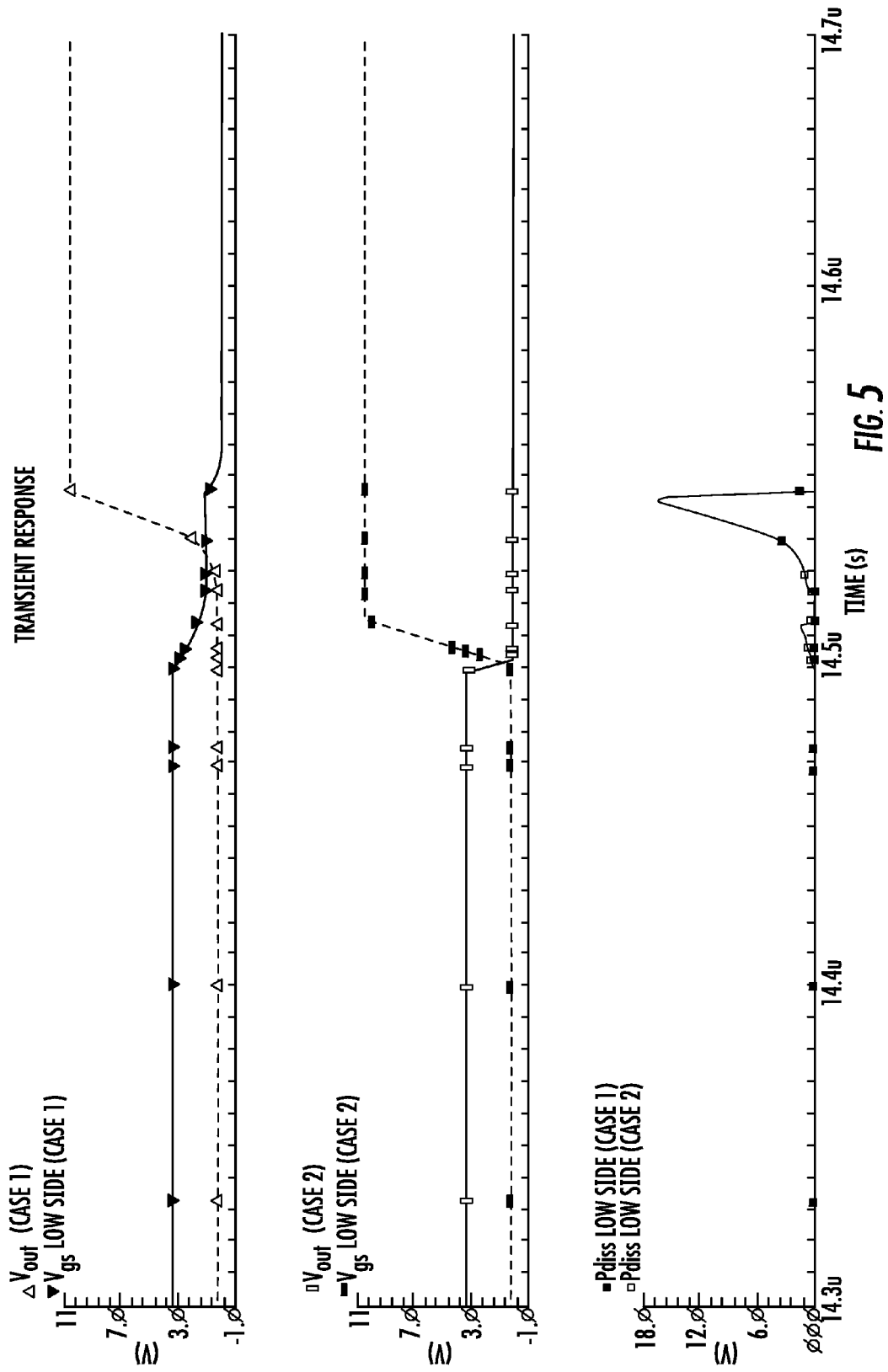

The third chart of FIG. 5 shows the comparison between the dissipated powers of the above 2 cases. It will be particularly appreciated herein that, with the same slope, the response delay of the output voltage VoutA from the control is much shorter than in the case 2.

case of Iout>Iripple

Particularly, FIGS. 6A, 6B and 6C show second (FIG. 6A) and third (FIG. 6B) embodiments of a diagram of the switching amplifier 9 of the present disclosure, when the control signal VinA, VinB is in-phase at the inputs inA and inB, and the output current signal Iload is higher than the current Iripple. Referring now to FIG. 6A, the electronic device 8 is shown to comprise a single capacitor 15 and a single shunt device S1. The capacitor 15 has a first terminal 15A and a second terminal 15B where, in the particular embodiment as shown in FIGS. 6A and 6B, such second terminal 15B of the first capacitor 15 is connected to ground GND.

The electronic device 8 is shown to comprise a comparison and control circuit or means 20, that are configured to: receive at their input at least the control signal VinA present at the first input terminal inA of the switching amplifier 9; and generate, at the output of the comparison and control circuit 20, a first controlling signal Vctrl1, for controlling the selector device S1, such that at least the first terminal 15A or the second terminal 15B of the first capacitor 15 may be connected to the first output terminal outA and/or the second output terminal outB and/or left floating.

In order to generate such first controlling signal Vctrl1, a comparison step is first carried out, for comparing the value of the load current Iload with the value of the ripple current Iripple, and if such load current Iload is higher than the ripple current Iripple, then a potential value VoutA is detected at the first output terminal outA and a second potential value VoutB is detected at the second output terminal outB of the switching amplifier 9.

Furthermore, a third potential value V is detected between the first 15A and the second 15B terminals of the first capacitor 15, such that the first terminal 15A of the first capacitor 15 may be connected to the first output terminal outA and/or the second output terminal outB if the first potential value VoutA or the second potential value VoutB is equal to the third potential value V' present at the ends of the capacitor 15.

Referring now to FIG. 6B, it may be noted that, in addition to the first capacitor 15, the electronic device 8 also comprises a second capacitor 16, whose capacitance value is preferably equal to that of the capacitor 15, and which has its own first and second terminals 16A, 16B. It should be noted that the use of both capacitors 15 and 16 allows the circuit of FIG. 6B, unlike the circuit of FIG. 6A, to advantageously limit power dissipation in the amplifier even when the result of the comparison between the output current Iload and the ripple current Iripple is Iload<Iripple. Indeed, a single capacitor, such as the capacitor 15 of the circuit of FIG. 6A, cannot provide such advantages, as such capacitor shall remain floating or at the most connected to one of the outputs only, whereas the approach of FIG. 6B provides advantages on both half bridges 9A, 9B.

In addition to the first shunt device S1, the electronic circuit 8 also comprises a second shunt device S2, where the first shunt device S1 is operably connected between the first terminal 15A of the first capacitor 15 and the first output terminal outA of the switching amplifier 9 and the second shunt device S2 is operably connected between the first terminal 16A of the second capacitor 16 and the second output terminal outB of the switching device 9. It shall be noted that the shunt devices S1 and S2 consist of electronic switches, that are adapted to be controlled by the comparison and control means 20 through the signals Vctrl1 and Vctrl2. The second terminal 15B of the first capacitor 15 is connected to ground GND, as is the second terminal 16B of the second capacitor 16.

In the embodiment of FIG. 6B, the comparison and control circuit 20 is configured to receive at its input at least the control signal VinB present on the second input terminal inB of the switching amplifier 9 and is configured to generate, at their output: the first controlling signal Vctrl1, for controlling the first shunt device S1, such that the first terminal 15A of the first capacitor 15 may be connected to the first output terminal outA and/or the second output terminal outB and/or left floating; and a second controlling signal Vctrl2, for controlling the second shunt device S2, such that the first terminal 16A of the second capacitor 16 may be connected to the first output terminal outA and/or the second output terminal outB and/or left floating. It shall be noted that the comparison and control circuit 20 controls the positions of the shunt devices S1 and 32 comprises a block, which is essentially composed of comparators and a logic circuit. Particularly, the signals Vctrl1 and Vctrl2 indicate the output outA or outB to which the capacitor 15 or 16 shall be connected or whether the latter has to be left floating. For this purpose, a fourth potential value V is detected between the first 16A and the second 16B terminals of the second capacitor 16, and such second capacitor 16 is connected to the first output terminal outA and/or the second output terminal outB if the first potential value VoutA or the second potential value VoutB is equal to such fourth potential value V".

Referring now to FIG. 6C, which still relates to the embodiment as shown in FIG. 6B, but with the comparison and control circuit 20 not implemented in the electronic device 8, on the rising edge 21, the current that should have flown in the MOS transistor 12 charges the capacitor 15, which will eliminate or at least reduce the power dissipated by the MOS transistor 13 (i.e. the low-side driver). Whereas on the falling edge 22, where the MOS transistor 13 (i.e. the low-side driver) also causes the fall, the discharge current of the capacitor 15 will be added to the current Iload.

Therefore, the power dissipated by the MOS transistor 13 (i.e. the low-side driver) will be higher than that obtained without the capacitor 15 and, on the average, the dissipated power reduction effect achieved when Iload is lower than Iripple would not be obtained. Nevertheless, the capacitors 15 and 16 are connected to the outputs through the shunt devices S1 and S2, which allow each capacitor to be connected to the output outA, to the output outB or to be left isolated or floating.

Particularly, each capacitor 15, 16 will be connected by the comparison and control circuit 20 to the corresponding output, i.e. the capacitor 15 to the output outA and the capacitor 16 to the output outB if, immediately before switching from H (High) to L (Low) or from L (Low) to H (High). The output outA, outB has voltages lower than the supply Vdd or higher than the ground GND, i.e. the output outA, outB is not recirculating current (points A, B and C of FIG. 6C).

Each capacitor 15, 16 will be left or held floating if, immediately before switching from H (High) to L (Low) or from L (Low) to H (High), each of the outputs outA, outB has voltages higher than the supply Vdd or lower than the ground GND, i.e. the output is recirculating current (points E, F of FIG. 6C). This may occur regardless of whether such comparisons are performed when Iout is higher or lower than Iripple. In these cases, such capacitor will be connected to the next transition from H (High) to L (Low) or from L (low) to H (High) respectively (according to the voltage on the capacitor) of the other half bridge 9A or 9B that, in these conditions, i.e. with the current IoutA=−IoutB, will be able to benefit from the capacitor 15 or 16 connected in parallel to the output.

In the middle portion of the positive or negative half waves (zones H and K in FIG. 6C), the capacitors 15, 16 may be held connected to the output/s or left floating. In the latter case, leakage currents should be prevented from appreciably changing the charge of the capacitor 15, 16.

In general, the capacitors 15, 16 must always be connected to the outputs and only outA, outB that are at a potential Voua, VOUTB, respectively, approximately equal to V', V" present at the ends of such capacitors 15, 16. The charge and discharge capacity of these capacitors 15, 16 during subsequent transitions from H (High) to L (Low) or L (Low) to H (High) give rise to an exchange of energy that, in first approximation, does not result in power dissipation.

Particularly, distinct capacitors 15, 16, simultaneously connected to the outputs outA and outB, will provide savings on switching losses for output currents Iload lower than the ripple current Iripple in the inductors L of the filter 11. It shall be noted that the reduction of the dissipated power in this case is:

$$P(save)=2*C*fsw*Vdd*Vdd;$$

because, although the edges in which switching Pdiss is eliminated are half as much, the capacitance connected to the outputs is twice.

The series resistance of the shunt devices S1 or S2 provides a very low power dissipation, because current always flows when the potential drop at the ends of the shunt is virtually zero. Furthermore, since the RMS current that flows through the half bridge is lower, typically <<1/10 than the output current Iload, the switch may be formed with parts having a relatively high Rds-on, without causing any appreciable efficiency loss in the system. The resistance of these switches is utilized to limit current spikes that occur when the voltage V', V" at the ends of the capacitors 15, 16 is not exactly identical to the output voltage VoutA, VoutB to which they are connected.

Figure 7A:
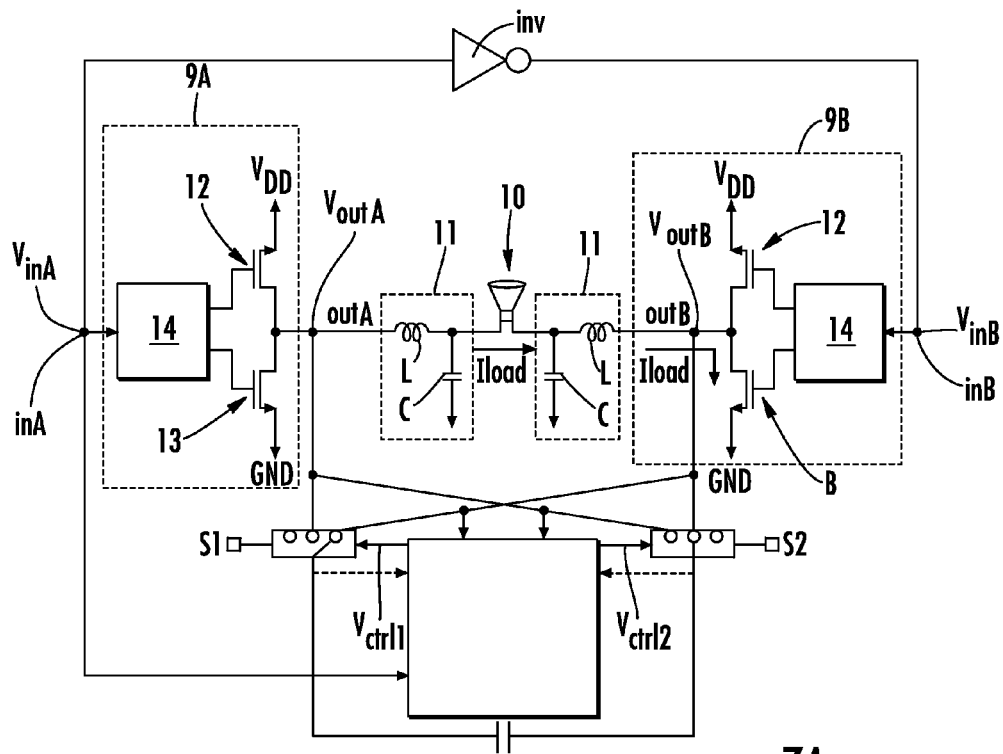
FIG. 7A shows a fourth embodiment of the diagram of a switching amplifier of the present disclosure, when the switching amplifier is controlled by an out-of-phase control signal.
Figure 7B:
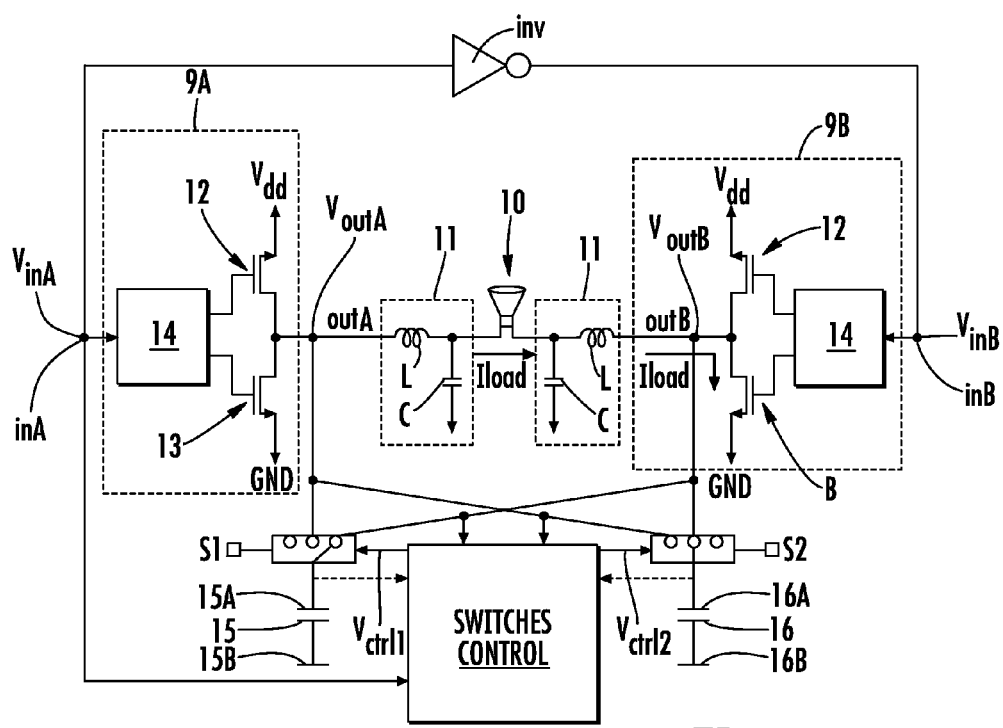
FIG. 7B shows a fifth embodiment of the diagram of a switching amplifier of the present disclosure, when the switching amplifier is controlled by an out-of-phase control signal.

FIGS. 7A, 7B and 7C illustrate the electronic device 8 as shown in FIGS. 6A, 6B and 6C, when the inputs inA, inB of the switching amplifier 9 are controlled by out-of-phase control signals through the phase inverter INV. Particularly, the two half bridges 9A and 9B of the switching amplifier 9 are controlled by the same input signal Vin but with its phase inverted by 180 degrees by way of the above mentioned inverter INV.

Since the outputs outA and outB of the two half bridges 9A and 9B always have a simultaneous switching operation, the edge at which the capacitor 15 or 16 is conveniently applied is on both outputs outA and outB. Therefore, there will be no way to double the capacitance at one output but capacitors and channels may be exchanged: for example, referring to FIG. 7C, at time 1 the capacitor 15 is connected to the output outA and the capacitor 16 is connected to the output outN, whereas at time 2 the capacitor 15 is connected to the output outB and the capacitor 16 is connected to the output outA. Alternatively, instead of the capacitors 15 and 16, a single capacitor may be used, which is placed between the outputs outA and outB in a balanced manner by the shunt devices S1 and S2 (FIG. 7A).

Figure 8:
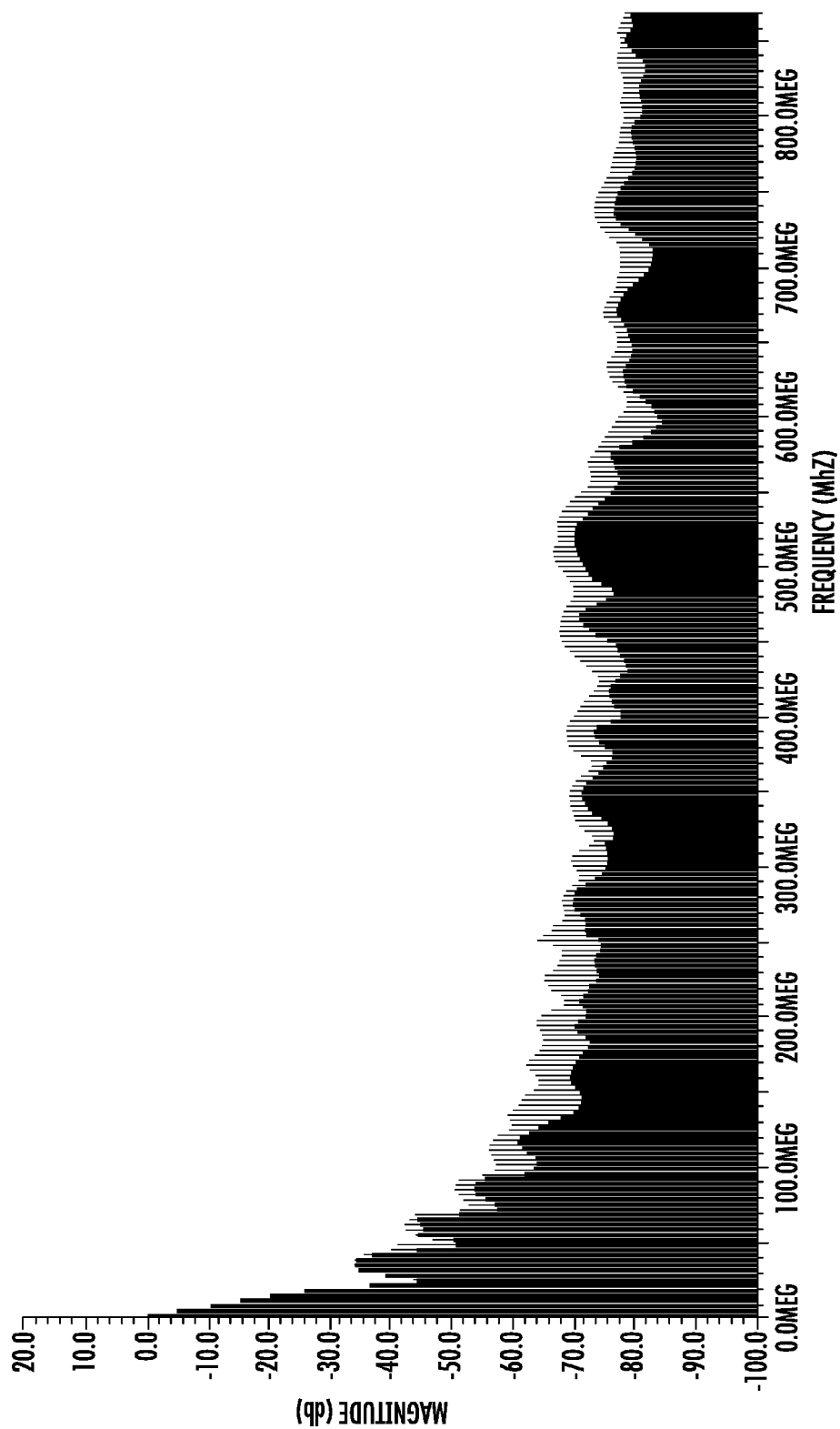
FIG. 8 shows a simulation of the circuit of FIG. 2A or FIG. 6B with no output signal (i.e. under a so-called quiescent condition).

Referring now to FIG. 8, there is shown an exemplary FTT under quiescent conditions of the output signal Iload. The magnitude of the harmonics of the switching frequency are shown to be reduced by even more than 10 dB. In car audio applications of PWM audio power devices, with the capacitors 15 and 16 having a capacitance of 2.2 nF, a supply voltage Vdd of 14.4 V, a switching frequency fsw of 400 kHz, there will be a reduction of the dissipated power Pdiss, with edges having the same slope, of 365 mW for each half bridge 9A and 9B. Since many electronic devices have as many as four half-bridge stages therein, dissipated power savings P(save) may reach about 1.5 W.

This approach may be useful to reduce the Pdiss to levels that allow power dissipation with no additional element, i.e. only using the printed circuit as a dissipator. In these cases, there is typically a junction-to-ambient thermal resistance of 25-35 degrees/W. Therefore, a 1.5 W saving may lead to a decrease of Tj from 37.5 degrees to 52.5 degrees as compared with the prior art system.

The drawback of this system may be the requirement one or two additional pins for each bridge for capacitor connection, but this problem will be easily solved with expected future packages, of BGS (Ball Grid Array) or WLP (Wafer Level Package) type, that may be equipped with a very large number of connections per chip.

Those skilled in the art will obviously appreciate that a number of changes and variants as described above may be made to the method and electronic circuit for reducing power dissipation in a switching amplifier as described above, to fulfill particular requirements, without departure from the scope of the invention, as defined in the following claims.

That which is claimed is:

1. A method of reducing power dissipation in a switching amplifier, the method comprising:
   providing a switching amplifier having first and second input terminals and first and second output terminals, the first and second output terminals to be coupled to a load through a low-pass filter having a filter inductor and a filter capacitor;
   controlling the first and the second input terminals based upon a control signal;
   detecting a load current flowing in the load when the switching amplifier is controlled by the control signal;
   detecting a ripple current superimposed on the load current when the switching amplifier is controlled by the control signal; and
   comparing the load current with the ripple current and, if the load current is greater than the ripple current, then
      detecting a first potential value at the first output terminal of the switching amplifier,
      detecting a second potential value at the second output terminal of the switching amplifier,
      detecting a third potential value between first and second terminals of a first capacitor,
      coupling the first terminal of the first capacitor to at least one of the first output terminal and the second output terminal, and
      coupling the second terminal of the first capacitor to a reference voltage, the first output terminal, or the second output terminal based upon whether the first potential value or the second potential value is equal to the third potential value.

2. The method of claim 1 further comprising:
   providing a second capacitor having first and second terminals;
   detecting a fourth potential value between the first and the second terminals of the second capacitor; and
   coupling the second capacitor to at least one of the first output terminal and the second output terminal, the second terminal of the second capacitor being coupled to the reference voltage if at least one of the first potential value and the second potential value is equal to the fourth potential value.

3. The method of claim 2 further comprising coupling each of the first and second capacitors to a corresponding one of the first output terminal and the second output terminal when the first and second potential values are not recirculating current.

4. The method of claim 2 further comprising maintaining the first and the second capacitors in a floating state when the first and second potential values are recirculating current.

5. The method of claim 1 wherein the controlling of the first and the second input terminals based upon the control signal comprises controlling the first input terminal based upon the control signal and controlling the second input terminal based upon an out-of-phase control signal, and vice versa.

6. The method of claim 1 wherein if the load current is less than the ripple current then:
   coupling the first terminal of the first capacitor to the first output terminal and the second terminal of the first capacitor to the reference voltage; and
   coupling a first terminal of a second capacitor to the second output terminal and a second terminal of the second capacitor to the reference voltage.

7. The method of claim 1 wherein the control signal comprises a pulse width modulated (PWM) signal.

8. A method of reducing power dissipation in a switching amplifier having first and second input terminals and first and second output terminals, the first and second output terminals to be coupled to a load, the method comprising:
  detecting a ripple current superimposed on a load current when the switching amplifier is controlled by a control signal; and
  comparing the load current with the ripple current and, if the load current is greater than the ripple current, then
    detecting a first potential value at the first output terminal of the switching amplifier,
    detecting a second potential value at the second output terminal of the switching amplifier,
    detecting a third potential value between first and second terminals of a first capacitor,
    coupling the first terminal of the first capacitor to at least one of the first output terminal and the second output terminal, and
    coupling the second terminal of the first capacitor to a reference voltage, the first output terminal, or the second output terminal based upon whether the first potential value or the second potential value is equal to the third potential value.

9. The method of claim 8 further comprising:
  providing a second capacitor having first and second terminals;
  detecting a fourth potential value between the first and the second terminals of the second capacitor; and
  coupling the second capacitor to at least one of the first output terminal and the second output terminal, the second terminal of the second capacitor being coupled to the reference voltage if the first potential value or the second potential value is equal to the fourth potential value.

10. The method of claim 9 further comprising coupling each of the first and second capacitors to a corresponding one of the first output terminal and the second output terminal when the first and second potential values are not recirculating current.

11. The method of claim 9 further comprising maintaining the first and the second capacitors in a floating state when the first and second potential values are recirculating current.

12. An electronic circuit for a switching amplifier comprising first and second input terminals and first and second output terminals, the first and second output terminals to be coupled to a load, the electronic circuit comprising:
  a first capacitor having first and second terminals;
  at least one first shunt device coupled between said first terminal of said first capacitor and at least one of the first and second output terminals of the switching amplifier; and
  a comparison and control circuit configured to
    receive a signal from the first input terminal of the switching amplifier, and
    generate a first control signal for controlling said at least one first shunt device such that at least one of the first terminal and the second terminal of the first capacitor is coupled to the first output terminal or the second output terminal or left in a floating state, the first control signal being based on a comparison between a potential difference value between the first and second terminals of said first capacitor and a voltage value on at least one of the first output terminal and the second output terminal.

13. The electronic circuit of claim 12 further comprising:
  a second capacitor having first and second terminals;
  a second shunt device;
  said at least one first shunt device being coupled between said first terminal of said first capacitor and the first output terminal of the switching amplifier;
  said second shunt device being coupled between said first terminal of said second capacitor and the second output terminal of the switching amplifier;
  said comparison and control circuit configured to
    receive a signal on the second input terminal of the switching amplifier,
    generate the first control signal for controlling said at least one first shunt device such that at least one of the first terminal and the second terminal of the first capacitor is coupled to the first output terminal or the second output terminal or left in a floating state, the first control signal being based on a comparison between a potential difference value present between the first and second terminals of said first capacitor and a voltage value on at least one of the first output terminal and the second output terminal, and
    a second control signal for controlling said second shunt device such that the first terminal of the second capacitor is coupled to at least one of the first output terminal and the second output terminal or left in a floating state, the second control signal being based on a comparison between a potential difference value between the first and second terminals of said second capacitor and a voltage value on at least one of the first output terminal and the second output terminal.

14. The electronic circuit of claim 12 further comprising a phase-inverting device configured to invert a phase of the signal from the first input terminal of the switching amplifier, said phase-inverting device being coupled between the first input terminal and the second input terminal of the switching amplifier and configured to control the first input terminal by the signal from the first input terminal of the switching amplifier and the second input terminal by an out-of-phase signal from the first input terminal of the switching amplifier, and vice versa.

15. The electronic circuit of claim 13 wherein said second terminal of said first capacitor is coupled to the reference voltage; and wherein said second terminal of said second capacitor is coupled to the reference voltage.

16. The electronic circuit of claim 12 wherein said first terminal of said first capacitor is coupled to the first output terminal; and wherein said second terminal of said first capacitor is coupled to the second output terminal.

17. The electronic circuit of claim 12 wherein said second terminal of said first capacitor is coupled to the reference voltage.

18. An electronic circuit comprising:
  a switching amplifier comprising first and second input terminals and first and second output terminals, the first and second output terminals to be coupled to a load;
  a first capacitor and a second capacitor, each having a first terminal and a second terminal;
  said first terminal of said first capacitor being coupled to the first output terminal and said second terminal of said first capacitor being coupled to a reference voltage;
  said first terminal of said second capacitor being coupled to the second output terminal of said switching amplifier, and said second terminal of said second capacitor being coupled to the reference voltage; and
  a phase-inverting device configured to invert a phase of the signal from the first input terminal of said switching amplifier, said phase-inverting device being coupled between the first input terminal and the second input terminal of said switching amplifier and configured to control the first input terminal by the signal from the first input terminal of said switching amplifier and the second input terminal by an out-of-phase signal from the first input terminal of said switching amplifier, and vice versa.

19. The electronic circuit of claim 18 wherein said first terminal of said first capacitor is coupled to the first output terminal; and wherein said second terminal of said first capacitor is coupled to the second output terminal.

20. The electronic circuit of claim 18 wherein said second terminal of said first capacitor is coupled to the reference voltage.

21. An electronic circuit comprising:
- a switching amplifier comprising first and second input terminals and first and second output terminals, the first and second output terminals to be coupled to a load; and
- a first capacitor and a second capacitor, each having a first terminal and a second terminal;
- said first terminal of said first capacitor being coupled to the first output terminal and said second terminal of said first capacitor being coupled to the second output terminal;
- said first terminal of said second capacitor being coupled to the second output terminal of said switching amplifier, and said second terminal of said second capacitor being coupled to the reference voltage.

* * * * *